United States Patent
Omstead et al.

(10) Patent No.: US 6,902,620 B1
(45) Date of Patent: Jun. 7, 2005

(54) ATOMIC LAYER DEPOSITION SYSTEMS AND METHODS

(75) Inventors: Thomas R. Omstead, Fremont, CA (US); Karl B. Levy, Los Altos, CA (US)

(73) Assignee: Novellus Systems, Inc., San Jose, CA (US)

( * ) Notice: Subject to any disclaimer, the term of this patent is extended or adjusted under 35 U.S.C. 154(b) by 28 days.

(21) Appl. No.: 10/028,610

(22) Filed: Dec. 19, 2001

(51) Int. Cl.[7] .......................... C30B 25/00; C30B 23/00
(52) U.S. Cl. .......................... 117/107; 117/84; 117/88; 117/89; 117/92; 117/93; 117/98; 117/102; 117/103; 117/105; 117/108
(58) Field of Search .................. 117/84, 88, 89, 117/92, 93, 98, 102, 103, 105, 107, 108

(56) References Cited

U.S. PATENT DOCUMENTS

| | | | | |
|---|---|---|---|---|
| 4,058,430 A | * | 11/1977 | Suntola et al. | 427/255.13 |
| 4,389,973 A | * | 6/1983 | Suntola et al. | 118/725 |
| 4,545,136 A | * | 10/1985 | Izu et al. | 34/636 |
| 4,976,996 A | | 12/1990 | Monkowski et al. | |
| 5,125,360 A | * | 6/1992 | Nakayama et al. | 118/730 |
| 5,251,148 A | * | 10/1993 | Haines et al. | 700/282 |
| 5,656,338 A | * | 8/1997 | Gordon | 427/576 |
| 5,770,469 A | | 6/1998 | Uram et al. | |
| 5,781,693 A | * | 7/1998 | Ballance et al. | 392/416 |
| 5,866,213 A | * | 2/1999 | Foster et al. | 427/573 |
| 5,879,459 A | * | 3/1999 | Gadgil et al. | 118/715 |
| 5,916,365 A | * | 6/1999 | Sherman | 117/92 |
| 5,997,588 A | * | 12/1999 | Goodwin et al. | 29/25.01 |
| 6,143,082 A | * | 11/2000 | McInerney et al. | 118/719 |
| 6,143,128 A | * | 11/2000 | Ameen et al. | 156/345.24 |
| 2002/0195056 A1 | * | 12/2002 | Sandhu et al. | 118/719 |

OTHER PUBLICATIONS

Rossnagel et al. "Plasma enhanced atomic layer deposition of Ta and Ti for interconnect diffusion barriers", Jul./Aug. 2000, J. Va. Sci. Technol. B 18(4), pp 2016–2020.*

* cited by examiner

*Primary Examiner*—Nadine G. Norton
*Assistant Examiner*—Matthew Song
(74) *Attorney, Agent, or Firm*—MacPherson Kwok Chen & Heid LLP; Tom Chen

(57) ABSTRACT

Atomic layer deposition systems and methods are disclosed utilizing a multi-wafer sequential processing chamber. The process gases are sequentially rotated among the wafer stations to deposit a portion of a total deposition thickness on each wafer at each station. A rapid rotary switching of the process gases eliminates having to divert the process gases to a system vent and provides for atomic layer film growth sufficient for high-volume production applications. Conventional chemical vapor deposition can also be performed concurrently with atomic layer deposition within the multi-wafer sequential processing chamber.

29 Claims, 7 Drawing Sheets

ATOMIC LAYER DEPOSITION SYSTEMS AND METHODS

BACKGROUND OF THE INVENTION

1. Field of the Invention

The present invention relates generally to semiconductor processing and, more particularly, to chemical vapor deposition.

2. Related Art

Atomic layer deposition (ALD), also known as atomic layer chemical vapor deposition (ALCVD), is a method for producing very thin films that are highly conformal, smooth, and possess excellent physical properties. ALD uses volatile gases, solids, or vapors that are sequentially introduced (or pulsed) over a heated substrate. A first precursor is introduced as a gas, which is absorbed (or adsorbed) into the substrate and the reactor chamber is cleared of the gaseous precursor. A second precursor is introduced as a gas, which reacts with the absorbed precursor to form a monolayer of the desired material. By regulating this sequence, the films produced by ALD are deposited a monolayer at a time by repeatedly switching the sequential flow of two or more reactive gases over the substrate.

For example, FIGS. 1 through 4 illustrate a typical deposition sequence for producing a hypothetical film "AB" using ALD. FIG. 1 shows a drawing 100 illustrating the first step in the exemplary ALD deposition sequence that will deposit a layer of film on a substrate 102.

Drawing 100 shows the introduction of a precursor for element A (i.e., pulse A), designated $AR_x$, into the chemical vapor deposition (CVD) chamber (where "R" represents an arbitrary functional group and "X" represents the number of functional groups associated with the precursor). The precursor is absorbed (or adsorbed) onto the surface of substrate 102. The first step shown in drawing 100 must be performed below the pyrolysis temperature of the precursor so that the precursor does not spontaneously decompose.

FIG. 2 shows a drawing 200 illustrating the second step in the exemplary ALD deposition sequence. Drawing 200 shows an inert purge gas that is introduced into the CVD chamber to remove the precursor gas ARX to prevent it from directly reacting with the following precursor for element B. Consequently, any possibility of gas phase reaction between the two precursors is eliminated.

FIG. 3 shows a drawing 300 illustrating the third step in the exemplary ALD deposition sequence. Drawing 300 shows the introduction of a precursor for element B (i.e., pulse B), designated $BL_y$, into the CVD chamber (where "L" represents an arbitrary functional group and "y" represents the number of functional groups associated with the precursor).

The third step shown in drawing 300 can involve the actual introduction of element B into the film (as shown in FIG. 3) or it can simply involve the reduction of precursor $AR_x$ (e.g., leaving only element A). The two precursors, $AR_x$ and $BL_y$, will begin to react on the surface of substrate 102 during step three, with the AB compound being formed and the ligand R being evolved as a volatile species.

FIG. 4 shows a drawing 400 illustrating the fourth step in the exemplary ALD deposition sequence. Drawing 400 shows an inert purge gas that is introduced into the CVD chamber to remove the precursor for B from the CVD chamber. The surface reaction between the two precursors is finished, leaving a complete layer of film on substrate 102.

In some cases as mentioned above, the compound $BL_y$ serves only as a reducing agent, in which case, only a monolayer of element A remains on substrate 102.

ALD is performed in single wafer reactors with gas flows diverted to bypass when not in use and the four steps described above for FIGS. 1–4 performed sequentially. The type of gas is selected or switched by either opening valves in front of manual lines or orifices or through the use of a divert scheme which sends the gas that is currently not being used for deposition directly to the system vent. The typical ALD approach may be sufficient for research and development or low-volume production, but has a number of limitations.

For example, the throughput of the typical ALD approach is limited. The limitations of gas switching technology, as well as the time required to purge the single wafer showerhead and reactor, limit the total cycle to a typical time of approximately seven seconds. For a typical film having a single atomic layer of 2 Å, this translates to a deposition rate of approximately 17 Å per minute and, for a 40 Å layer, requires almost a three minute deposition time. This limits the overall throughput of the CVD module or reactor to approximately 20 wafers per hour, which is unacceptable for most production requirements. Single wafer processing chambers also have a significantly higher wafer transport and scheduling overhead as substrates must be moved to several modules.

Another drawback of single wafer systems is that in order to achieve the highest levels of throughput, the gas flow upstream of the throttle valve must be kept constant. Furthermore, to avoid recirculation and particle formation, it is desirable for the reactor chamber pressure to remain constant throughout the ALD cycle. Constant flows are necessary because the cycle times are too short for a typical throttle valve pressure control system to adequately respond. With a single wafer system, this requires a complex manifold in which the reactant gas flows are diverted downstream of the throttle valve and replaced by an equivalent purge flow.

Additional drawbacks of single wafer reactors include cost and repeatability issues. For example, the relatively complex manifold design inherent to single wafer systems leads to a high system cost. This is especially true because several single wafer chambers are required to provide a reasonable throughput. Additionally, each single wafer system consumes a position on a high-vacuum wafer transfer system. If the wafer transfer system is fully populated with single wafer systems to provide adequate throughput, a sufficient number of slots may not be available for other tasks. Also, single wafer systems operating in a parallel mode may have a bimodal distribution of process results, because all wafers are not experiencing the same process environment. This can lead to longer process startup and qualification times.

As a result, there is a need for improved systems and methods for the atomic layer deposition of thin films.

BRIEF SUMMARY OF THE INVENTION

Atomic layer deposition systems and methods are disclosed herein. In accordance with one embodiment, rotary gas switching is provided for the ALD process within a multi-wafer sequential processing chamber. In accordance with another embodiment, ALD and conventional CVD are performed concurrently within a multi-wafer sequential processing chamber. The systems and methods disclosed herein allow the ALD process to be implemented in high-volume manufacturing applications.

In accordance with one embodiment of the present invention, a method for performing atomic layer deposition includes providing a multi-wafer sequential deposition module having a plurality of wafer stations; inserting a plurality of wafers within the multi-wafer sequential deposition module; rotating the plurality of wafers in a sequential fashion among the plurality of wafer stations; depositing at least one monolayer on each of the plurality of wafers at each of the plurality of wafer stations; and rotating a plurality of process gases in a sequential fashion among the plurality of wafer stations to complete the atomic layer deposition on each of the plurality of wafers.

In accordance with another embodiment of the present invention, a method for performing atomic layer deposition in a multi-wafer sequential deposition module having a plurality of wafer stations includes moving a plurality of wafers in a sequential order among the plurality of wafer stations; introducing a first process gas at a first station of the plurality of wafer stations; introducing a second process gas at a second station of the plurality of wafer stations; and rotating the first process gas and the second process gas sequentially to at least the first wafer station and the second wafer station of the plurality of wafer stations to form an atomic layer deposition film on corresponding wafers from the plurality of wafers positioned at the first wafer station and the second wafer station.

In accordance with another embodiment of the present invention, a method for applying a deposition layer on a semiconductor substrate includes providing a multi-wafer sequential deposition module having a plurality of wafer stations and a plurality of showerheads; inserting a plurality of wafers within the multi-wafer sequential deposition module; flowing one or more types of gas compositions through one or more of the plurality of showerheads; and rotating the plurality of wafers in a sequential, continuous fashion under the plurality of showerheads until a desired thickness of the deposition layer is formed.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION OF THE INVENTION

Figure 1:
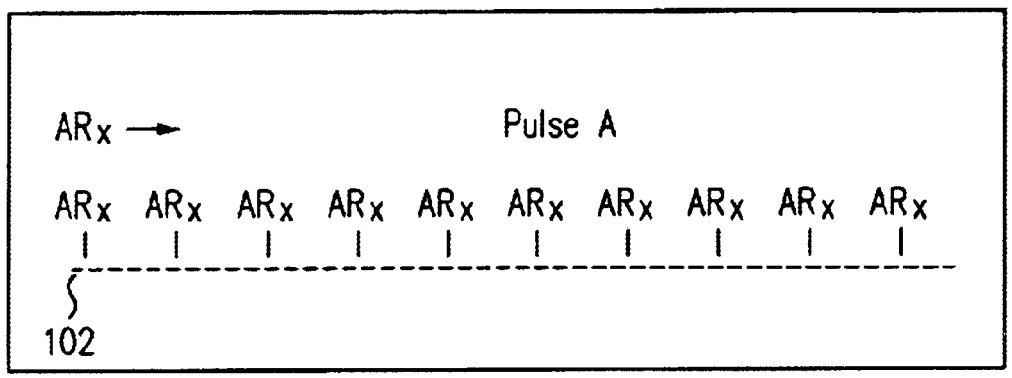
FIG. 1 shows schematically a first step in a conventional ALD deposition sequence.
Figure 2:
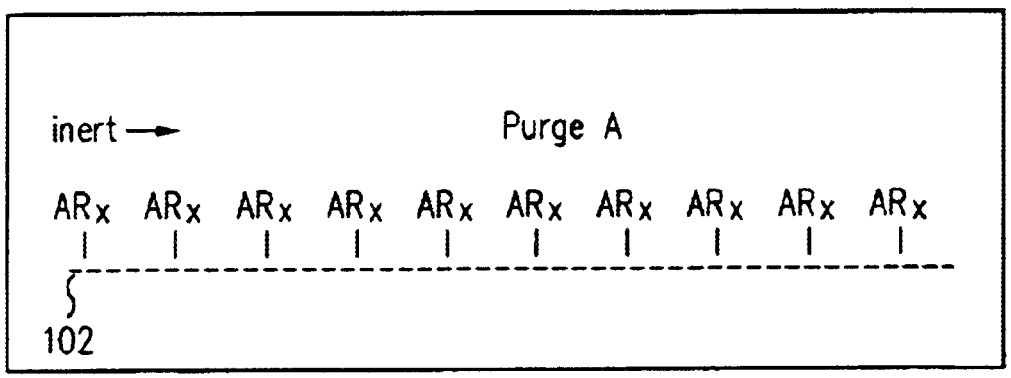
FIG. 2 shows schematically a second step in the ALD deposition sequence.
Figure 3:
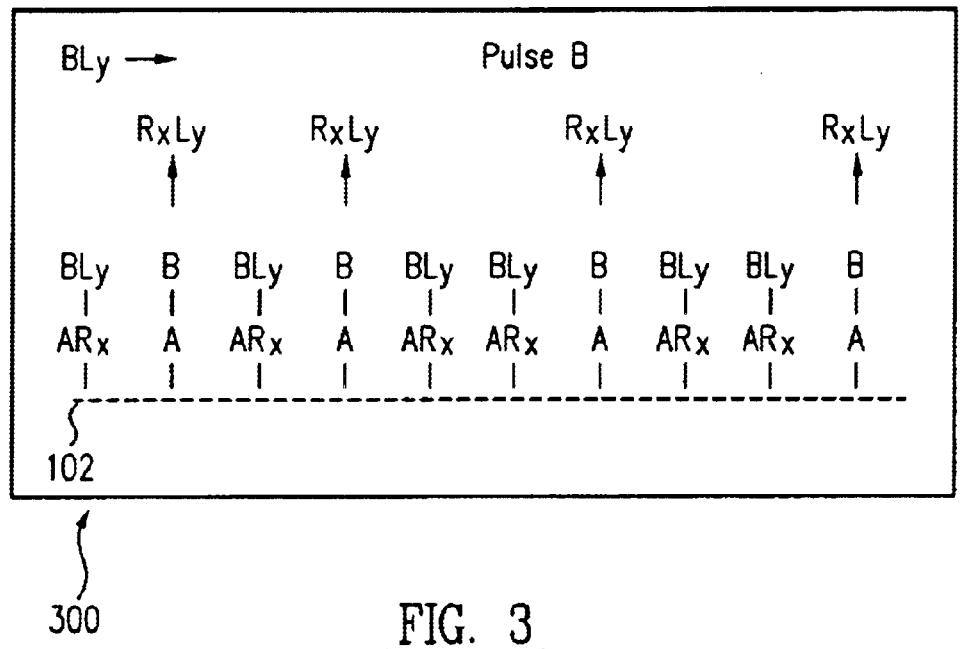
FIG. 3 shows schematically a third step in the ALD deposition sequence.
Figure 4:
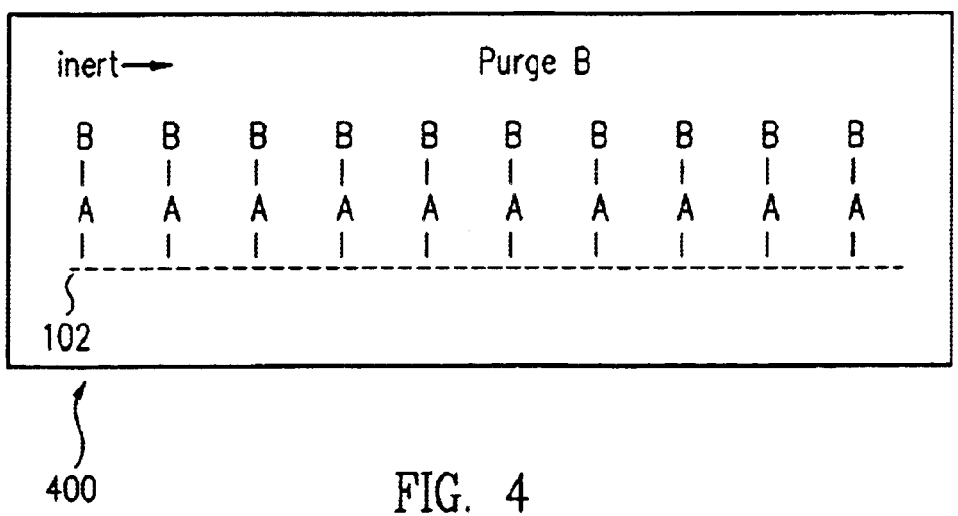
FIG. 4 shows schematically a fourth step in the ALD deposition sequence.
Figure 5:
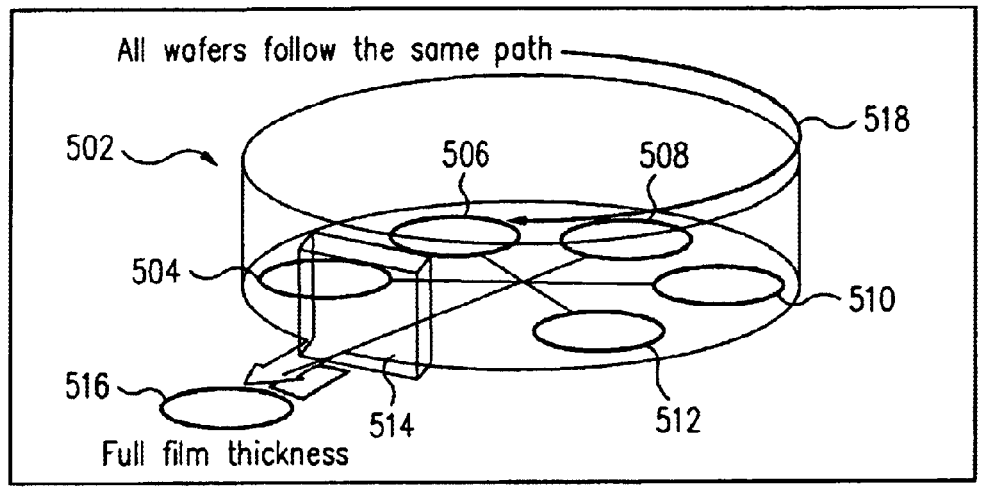
FIG. 5 shows a perspective view of a multi-wafer sequential deposition module in accordance with an embodiment of the present invention.

FIG. 5 shows a multi-wafer sequential deposition module 502 in accordance with an embodiment of the present invention. Multi-wafer sequential deposition module 502 includes five stations 504, 506, 508, 510, and 512 that are used to process wafers (e.g., such as wafer 516). Note that the number of stations provided by multi-wafer sequential deposition module 502 could vary depending upon the user's requirements. Stations 504 through 512 are each equipped with a wafer heater and a showerhead (which are not shown) and are optionally isolated from each other through the use of a continuous inert gas purge between, and independent pumping around, each station. An example of a multi-wafer sequential deposition module 502 is the Concept Three system by Novellus Systems (San Jose, Calif.).

Multiple wafers are processed sequentially and concurrently, receiving a portion of their total deposition thickness at each station. As an example, a wafer, such as wafer 516, enters multi-wafer sequential deposition module 502 from a load position through a load door 514. The wafers are then sequentially rotated to each station (e.g., wafer 516 moves from station 504 to station 506 . . . to station 512 following the path of a directional arrow 518) in multi-wafer sequential deposition module 502. At each of stations 504 through 512, a portion of the total film thickness (i.e., one or more monolayers) is deposited on wafer 516. As the wafers move to successive stations within multi-wafer sequential deposition module 502, a new wafer is introduced into multi-wafer sequential deposition module 502 while a completed wafer is removed.

The throughput and repeatability of the ALD process can be significantly enhanced by the method of multi-wafer sequential processing, using multi-wafer sequential deposition module 502, combined with a rapid rotary switching of the reactive process gas (as described in further detail herein). When the wafers are located between corresponding stations 504 through 512, an inert gas flow is provided to prevent undesired deposition. The inert gas flow can be at each station and around each station within multi-wafer sequential deposition module 502. Once the wafers are positioned at the desired corresponding stations in the rotation, the appropriate semiconductor processing step (i.e., ALD process) can begin.

Figure 6:
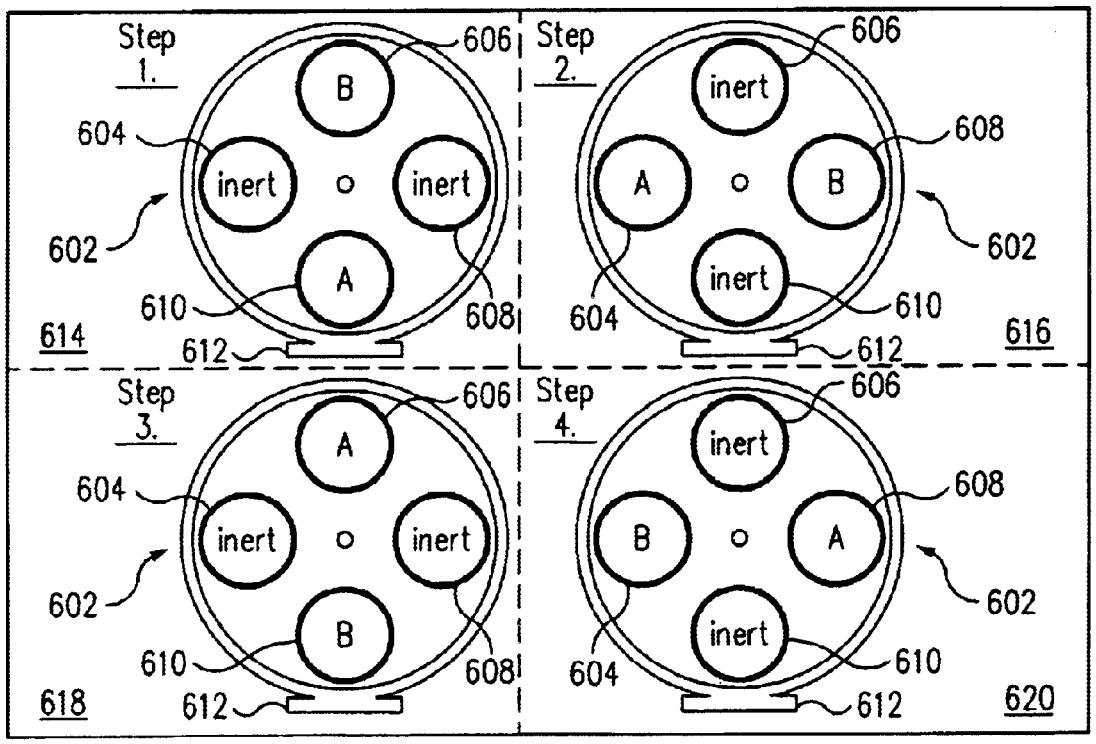
FIG. 6 illustrates from a top view an exemplary rotation of gases in a multi-wafer sequential deposition module in accordance with an embodiment of the present invention.

The desired gases (which may include a reactant gas, an ion stream, or a radical stream) for the semiconductor processing steps can be rotated (i.e., switched or redirected) quickly from one station to the next within multi-wafer sequential deposition module 502. As an example, FIG. 6 illustrates an exemplary rotation of gases in a multi-wafer sequential deposition module 602. Multi-wafer sequential deposition module 602 is similar to multi-wafer sequential deposition module 502, but has four stations (i.e., stations 604, 606, 608, and 610) rather than five stations (i.e., stations 504 through 512). The wafers enter and leave multi-wafer sequential deposition module 602 through a load door 612, which is similar to load door 514.

Snapshots 614, 616, 618, and 620 correspond to the exemplary steps 1 through 4 for the rotation of exemplary process gases A and B. As shown in snapshot 614, a process gas A is introduced into one section of multi-wafer sequential deposition module 602 at station 610 while process gas B is introduced into another section of multi-wafer sequential deposition module 602 at station 606.

Introducing an inert gas in the stations (i.e., stations 602 and 608) between the stations introducing a reactive gas (i.e., stations 606 and 610) can prevent the intermixing of incompatible process gases. This technique is illustrated in snapshots 614 through 620. The injection of an inert gas isolates the reactive gases from each other in multi-wafer sequential deposition module 602 and purges the showerhead of the corresponding station during transitions between the two reactive gases. However, if the two reactive gases are chemically compatible, then such use of inert gases may be eliminated.

A complete layer on the substrate surface of the wafers is deposited by cyclically rotating the gases as shown in snapshots 614 through 620. It should be understood that, generally, one or more complete monolayers are deposited on the substrate surfaces between sequential wafer rotations. Typically, several rotations of the gases are completed to form several monolayers on the substrate surfaces prior to the wafers rotating to the subsequent stations within multi-wafer sequential deposition module 602 (or multi-wafer sequential deposition module 502).

In snapshot 614, process gases A and B are introduced into stations 610 and 606, respectively, while an inert gas is introduced into stations 602 and 608. Snapshot 616 shows the first rotation of gases, with the introduction of the inert gas into stations 606 and 610 to purge the showerhead and isolate the process gases A and B, which are introduced into stations 604 and 608, respectively. Snapshot 618 shows the introduction of process gases A and B into stations 606 and 610, respectively, while the inert gas is introduced into stations 604 and 608. Finally, to complete the exemplary cycle for one layer in snapshot 620, process gases A and B are introduced into stations 608 and 604, respectively, while the inert gas is introduced into stations 606 and 610.

Snapshots 614 through 620 illustrate the rotary motion of gases in multi-wafer sequential deposition module 602. The rotation of gases can occur quickly to provide for atomic layer growth in a reasonable period of time. It should be understood that many other configurations or variations are possible in accordance with the principles of the present invention.

The gases may be switched or rotated to the various zones or stations through the use of conventional valves or through the use of a rotary ball valve (described in further detail below in reference to FIG. 12). As gases are not flowing to divert during the actual deposition sequence, the pressure within multi-wafer sequential deposition module 602 will remain stable at all times. Throughput is also enhanced as deposition is occurring on numerous wafers simultaneously.

As described above, the ALD process within multi-wafer sequential deposition module 502 or 602 can be utilized where one process gas is used as a deposition source while the other process gas is used solely or primarily as a reducing or oxidation agent. The deposition of tungsten (W) using tungsten hexafluoride ($WF_6$), with silane ($SiH_4$) as a reducing agent, is an example of this technique. The overall reaction for the deposition of tungsten is the following: 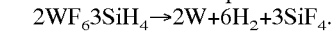

Figure 7:
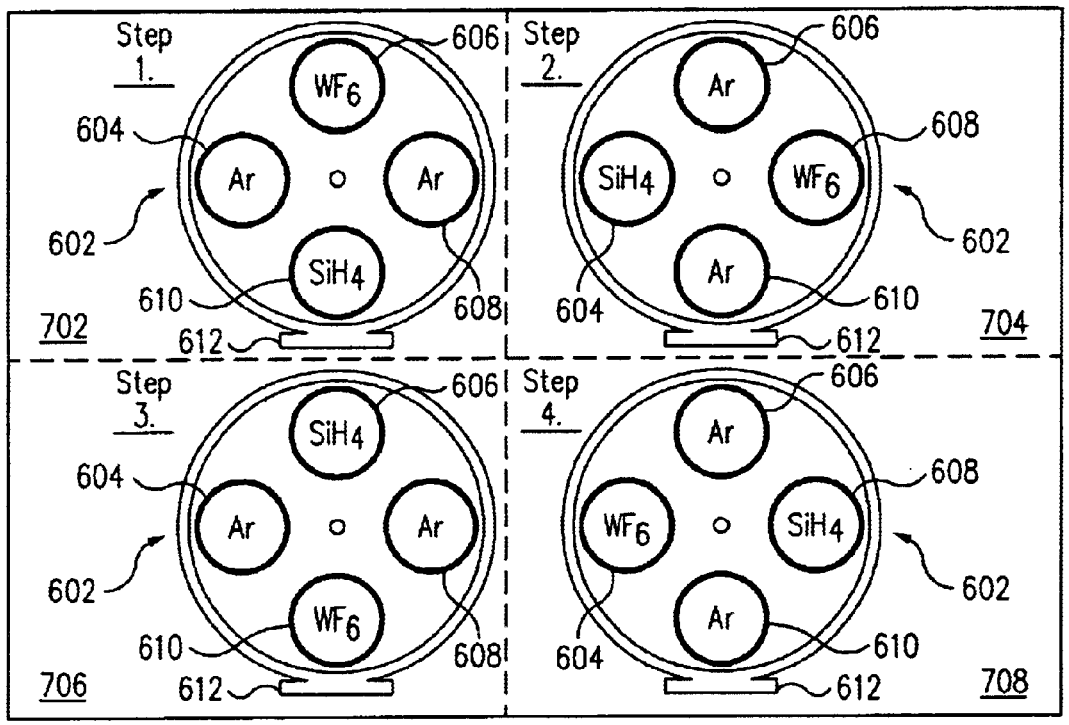
FIG. 7 illustrates an exemplary deposition of tungsten in the multi-wafer sequential deposition module of FIG. 6.

FIG. 7 illustrates an exemplary deposition of tungsten in multi-wafer sequential deposition module 602. In FIG. 7, there are four snapshots 702, 704, 706, and 708 corresponding to the exemplary steps 1 through 4 for the deposition of tungsten (W) from tungsten hexafluoride (WF6) and silane ($SiH_4$). Snapshots 702, 704, 706, and 708 illustrate the rotary motion of gases or rotary gas switching in multi-wafer sequential deposition module 602 (also referred to as a multi-wafer sequential processing chamber or batch reactor).

To perform this reaction using the ALD process or ALD mode, the process gases are rotated as illustrated in snapshots 702 through 708. For example, as shown in snapshot 702, tungsten hexafluoride ($WF_6$) is introduced into one section of multi-wafer sequential deposition module 602 at station 606 while silane ($SiH_4$) is introduced into another section of multi-wafer sequential deposition module 602 at station 610. In general, it should be understood that silane ($SiH_4$) is introduced into the appropriate station prior to the introduction of tungsten hexafluoride ($WF_6$).

The potential intermixing of tungsten hexafluoride ($WF_6$) with silane ($SiH_4$) is further prevented by the introduction of argon (Ar) in stations 604 and 608, which are between stations 606 and 610. As explained above, argon will serve to isolate the reactive gases from each other in multi-wafer sequential deposition module 602 and purges the showerhead of the corresponding station during transitions between the two reactive gases during the rotary switching of gases.

Snapshots 704 through 708 show the completion of one cycle for the deposition of tungsten. In snapshot 704, tungsten hexafluoride ($WF_6$) and silane ($SiH_4$) are introduced into stations 608 and 604, respectively, while argon (Ar) is introduced into stations 606 and 610. In snapshot 706, tungsten hexafluoride ($WF_6$) and silane ($SiH_4$) are introduced into stations 610 and 606, respectively, while argon (Ar) is introduced into stations 604 and 608. Finally, to complete the exemplary cycle for one layer in snapshot 708, tungsten hexafluoride ($WF_6$) and silane ($SiH_4$) are introduced into stations 604 and 608, respectively, while argon (Ar) is introduced into stations 606 and 610.

As illustrated in FIG. 7, tungsten hexafluoride ($WF_6$) and silane ($SiH_4$) are always separated by argon to prevent gas-phase reaction. Each station can be equipped with its own pumping ring and an argon curtain injected between stations (e.g., between stations 604, 606, 608, and 610) to further prevent the direct gas-phase interaction of the two precursors (i.e., tungsten hexafluoride ($WF_6$) and silane ($SiH_4$)).

This type of system offers many advantages, such as improved throughput, balancing, cost, slot usage, and repeatability. For example, 2.5 Å of tungsten per ALD cycle could be deposited. With the use of rapid rotary switching of gases and minimal-volume (or cone type) showerheads, a complete rotation of gases could occur every four seconds. This translates to a net deposition rate of 2.5 Å per second or 150 Å per minute. With an indexing time (station to station move time or wafer rotation time within multi-wafer sequential deposition module 602) of seven seconds, a typical 40 Å nucleation film could be deposited on wafers at a maximum rate of approximately 150 wafers per hour (assuming the wafers are pre-heated before introduction into multi-wafer sequential deposition module 602). Thus, throughput is greatly improved over conventional ALD techniques.

During the ALD deposition sequence, all process flows are introduced into multi-wafer sequential deposition module 502 or 602 without the use of a divert scheme (e.g., gas flows diverted to bypass, such as to the system vent or pump). Consequently, pressure and flow remain constant and the system is balanced. The simplicity of multi-wafer sequential deposition module 502 or 602 and corresponding gas manifold will lead to very low costs for a given throughput capability.

Additionally, a single module, such as multi-wafer sequential deposition module 502, has an equivalent throughput of up to five conventional single-wafer ALD modules, which increases the number of slots available on the wafer transfer system. Finally, repeatability is provided because every wafer moving through multi-wafer sequential deposition module 502 or 602 experiences an identical process environment.

Figure 8:
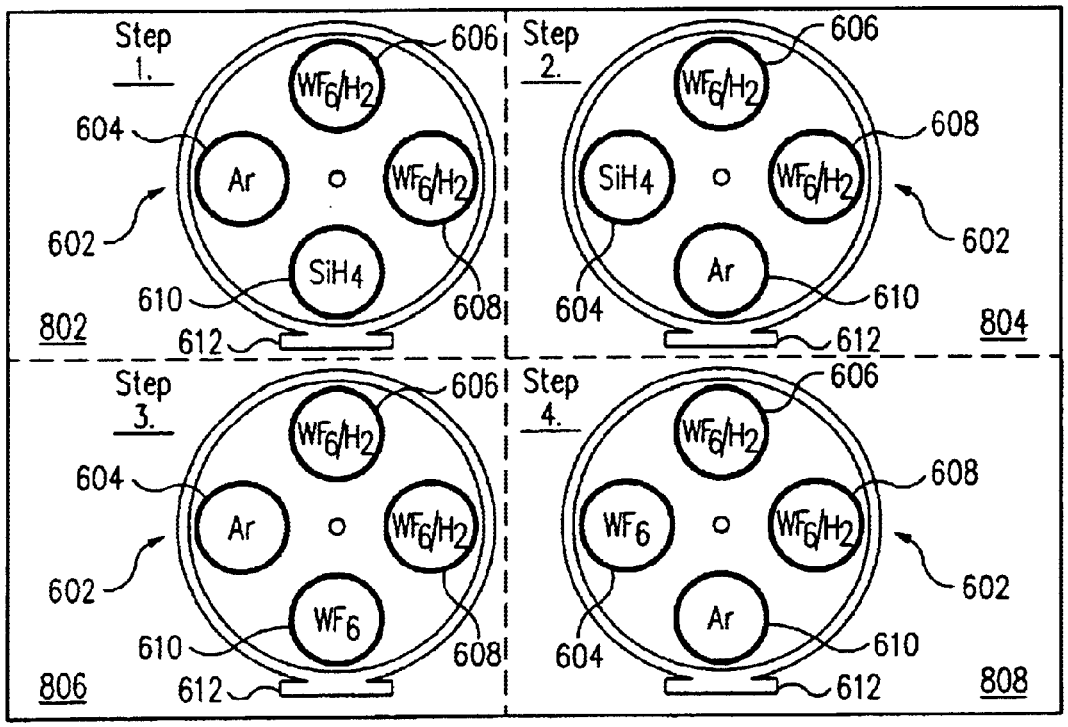
FIG. 8 illustrates the use of a multi-wafer sequential deposition module to perform ALD processing and conventional CVD processing concurrently in accordance with another embodiment of the present invention.

Multi-wafer sequential deposition module 502 or 602 may be used to perform ALD and conventional CVD in a single multi-station processing chamber, in accordance with another embodiment of the present invention. For example, the deposition of tungsten can be performed in a single chamber using ALD and conventional CVD techniques, as illustrated in FIG. 8. FIG. 8 shows the use of multi-wafer sequential deposition module 602 to perform ALD processing and conventional CVD processing concurrently.

FIG. 8 includes four snapshots 802, 804, 806, and 808 corresponding to the exemplary steps 1 through 4 for the deposition of tungsten by ALD and conventional CVD processing. In this example, ALD techniques will be used to perform deposition of tungsten (W) in stations 604 and 610 using silane ($SiH_4$) as a reducing agent. As discussed in reference to FIG. 6, silane ($SiH_4$) is used as a precursor, followed by tungsten hexafluoride ($WF_6$) as the next precursor, to form a monolayer of tungsten (W). Conventional CVD techniques will be used to perform deposition of tungsten (W) in stations 606 and 608 using hydrogen (H) as a reducing agent.

To perform ALD and conventional CVD concurrently within a single multi-station chamber, the process gases are introduced as illustrated in snapshots 802 through 808. For example, as shown in snapshot 802, tungsten hexafluoride ($WF_6$) and hydrogen ($H_2$, also known as dihydrogen) are introduced into one section of multi-wafer sequential deposition module 602 at stations 606 and 608 to perform conventional CVD of tungsten. In stations 604 and 610, argon (Ar) and silane ($SiH_4$), respectively, are introduced as a first step to perform ALD of tungsten. As discussed above, argon will serve to isolate the reactive gases from each other in multi-wafer sequential deposition module 602 and purge the showerhead of the corresponding station.

Snapshots 804 through 808 show the completion of one cycle for the deposition of tungsten. In snapshots 804 through 808, stations 606 and 608 may continue to receive tungsten hexafluoride ($WF_6$) and hydrogen ($H_2$). An inert gas may be introduced once the desired deposition layer is achieved. In snapshot 804, argon (Ar) and silane ($SiH_4$) are introduced into stations 610 and 604, respectively. In snapshot 806, argon (Ar) and tungsten hexafluoride ($WF_6$) are introduced into stations 604 and 610, respectively. In snapshot 808, argon (Ar) and tungsten hexafluoride ($WF_6$) are introduced into stations 610 and 604 to complete the ALD process.

The ALD deposition sequence in multi-wafer sequential deposition module 602 is different than that discussed above for FIG. 7. For example, the ALD deposition sequence for stations 604 and 610 now require periodically stopping the flow of the reactants or sending the reactants directly to the system pump (i.e., divert).

With additional stations added to multi-wafer sequential deposition module 602, as in multi-wafer sequential deposition module 502, more stations could be devoted to ALD. Rotary gas switching, as discussed above, could be performed while conventional CVD could be performed concurrently using the stations not devoted to ALD. As an example, if multi-wafer sequential deposition module 602 contained six stations, then ALD of tungsten could occur at four of the stations, as explained in reference to FIG. 7 with rotary gas switching, while conventional CVD of tungsten is occurring simultaneously in the remaining two stations.

As discussed above, multiple wafers (i.e., substrates) are processed sequentially and concurrently, receiving a portion of their total deposition thickness at each station. In accordance with one embodiment, the various gases are rapidly switched or redirected among the wafer stations and, preferably, the gases do not need to be directed to system vent during processing. A portion of the wafers' total deposition thickness is deposited at each station (i.e., at least one complete rotation of gases is performed prior to wafer rotation to the subsequent station).

Figure 9:
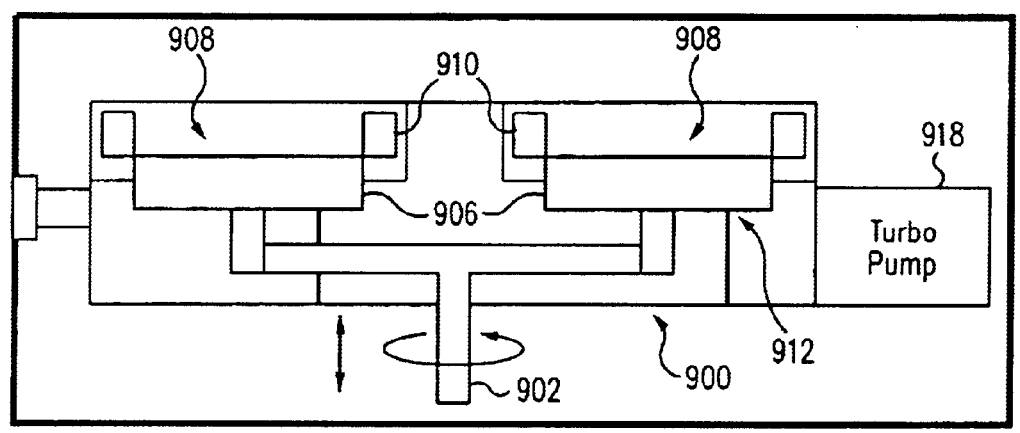
FIG. 9 illustrates a cross-sectional side view of a multi-wafer sequential deposition module in accordance with another embodiment of the present invention.

In an alternative embodiment, chemical vapor deposition or atomic layer deposition is performed by continually rotating the wafers under fixed injectors (also referred to as showerheads) as shown in FIG. 9. FIG. 9 illustrates a cross-sectional side view of a multi-wafer sequential deposition module 900, in accordance with another embodiment of the present invention. Multi-wafer sequential deposition module 900 includes a center post 902, cross-members 904, and stations 906.

As illustrated in FIG. 9 (by the circular arrow indicating rotation), center post 902 rotates at a given speed to rotate each wafer on its corresponding station 906 under showerheads 908. The showerheads 908 may disperse the gas across the wafers positioned on stations 906, with the gas then pumped-out through chambers 910.

An optional pump 918 (e.g., a turbo pump) is shown, which is used to pump multi-wafer sequential deposition module 900 down to a desired base pressure. Stations 906 can be individual stations or pedestals or be part of a ring containing a number of wafers, which is mounted over stations 906. A ring lift 912, which includes lift pins 916, is used to lift and position the ring containing the wafers. For example to insert or remove wafers from multi-wafer sequential deposition module 900, center post 902 along with cross-members 904 and stations 906 are lowered so that wafers can be placed on stations 906 or the ring containing the wafers can be placed on stations 906. A clamp 914 (or ring) may be used to secure the wafers to stations 906 and/or provide edge exclusion.

In general, showerheads 908 would each provide a type of gas composition, such as a reactant gas, an ion stream, or a radical stream, for example. The gas composition provided by showerheads 908 would typically not change during the ALD cycle, but could be changed depending upon the desired process. For the ALD cycle, multi-wafer sequential deposition module 900 allows the rotation of numerous wafers under showerheads 908 and, thus, exposing the wafers to alternating gas types very quickly. Furthermore, there is no need to purge the reactor between exposures, which allows a reduction in the ALD cycle time and an increase in the overall throughput.

As an example, showerheads 908 within multi-wafer sequential deposition module 900 may provide alternating types of gas composition. Thus, if there are four showerheads 908 and two reactant gases (e.g., A and B) are required, then two showerheads 908 will provide reactant gas A and two showerheads 908 will provide reactant gas B. Showerheads 908 providing reactant gas A may be grouped next to each other or separated by showerheads 908 providing reactant gas B. It should be understood that numerous combinations are possible, for atomic layer deposition or chemical vapor deposition, and fall within the scope of the present invention.

The various reactive gas stations located under each showerhead 908 can be isolated by an inert gas curtain positioned between showerheads 908, rather than physical walls, to allow rapid transfer of the wafers. Furthermore, any number of wafers can be simultaneously processed using this technique and is bounded only by physical space requirements. For example, multi-wafer sequential deposition module 900 may contain 4 stations 906 and utilize four showerheads 908. However, the number of stations 906 and the number of showerheads 908 may vary and the number of stations 906 may differ from the number of showerheads 908.

If plasma processing is desired, some or all of showerheads 908 may be electrically powered with radio frequency (RF) or other forms of power. In this manner, the wafers will be very quickly exposed to a plasma environment and then removed. Furthermore, showerheads 908 could also be equipped with a downstream plasma or ion beam device. Stations 906 may also be biased (i.e., the substrate holder for the wafer receives electrical power, such as RF or electromagnetic energy in the KHz or MHz frequency range, or other power forms to bias the wafer). The wafers may also be exposed to thermal or optical energy at these stations.

The injector height (i.e., height of showerheads 908 from the wafer surface) at individual stations may be modified (e.g., increased) to allow for suitable space for plasma processing. The injector height may vary during processing or may be set for each station prior to the start of the semiconductor processing steps. It should be understood that these techniques (e.g., electrically powered showerheads, downstream plasma or ion beam device from the showerhead, wafer biasing, variable showerhead to wafer spacing, etc.) may be applied also to one or more of the previous embodiments, such as those discussed in reference to FIGS. 5–8.

Figure 10:
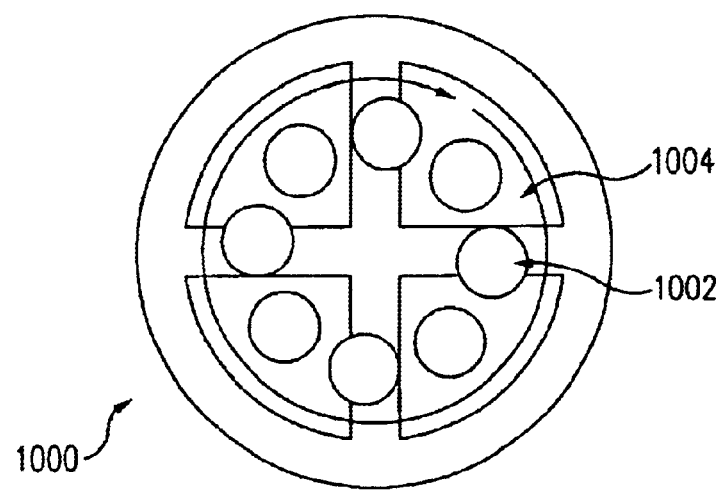
FIG. 10 illustrates a bottom view of a multi-wafer sequential deposition module in accordance with another embodiment of the present invention.
Figure 11:
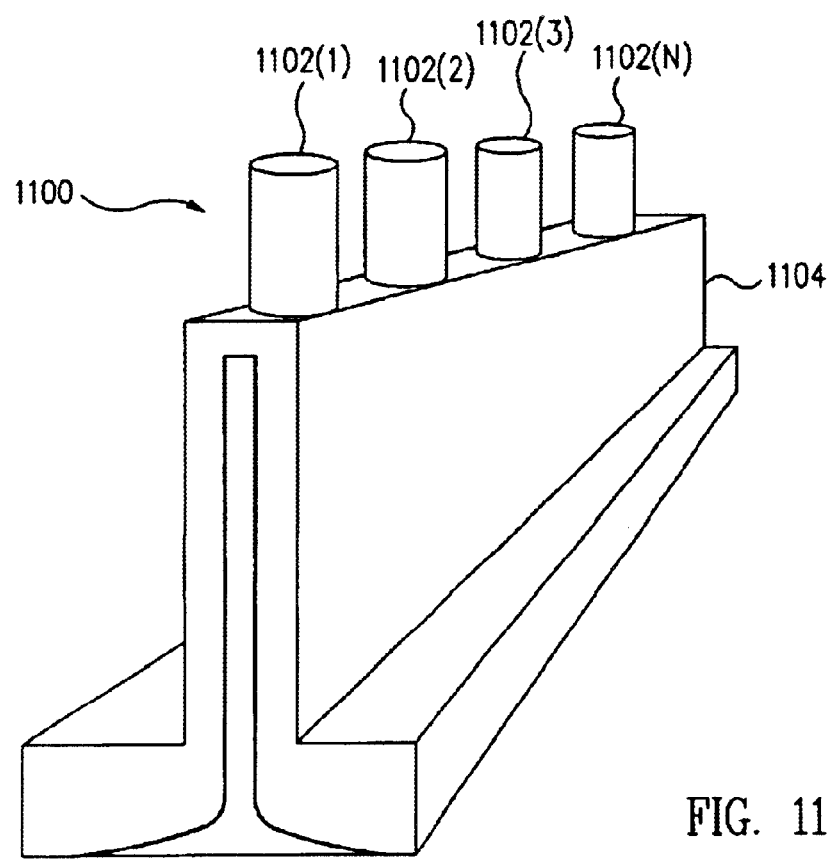
FIG. 11 illustrates a linear injector valve in accordance with an embodiment of the present invention.

Showerheads 908 may be of various shapes or designs, such as exemplary designs shown in FIGS. 10 and 11. FIG. 10 illustrates a bottom view of a multi-wafer sequential deposition module 1000 in accordance with another embodiment of the present invention. In FIG. 10 there is shown a number of stations 1002, which are rotated (as illustrated by the circular arrow) within multi-wafer sequential deposition module 1000 under showerheads 1004. Showerheads 1004 would contain numerous holes that inject a uniform flow of gases onto the wafer surface. The shape of showerheads 1004 may be triangular or delta shaped, with single or multiple zones to provide equal exposure to all areas of the wafer surface.

Alternatively, the showerheads for multi-wafer sequential deposition module 900 may be linearly shaped, as illustrated in FIG. 11, with radial gas flow modulation. FIG. 11 illustrates a linear injector valve 1100 in accordance with an embodiment of the present invention. Linear injector valve 1100 includes a number of injector valves 1102, which are separately referenced as 1102(1), 1102(2), 1102(3), . . . , 1102(N) and are attached to an injector valve body 1104. The gas composition enters linear injector valve 1100 through injector valves 1102, which provide radial, variable-flow modulation for optimization of gas composition dispersion.

Injector valves 1102 provide good uniformity as the gas flow can be modulated radially. For example, if injector valve 1102(1) is positioned at the inner radius while injector valve 1102(N) is positioned at the outer radius, injector valve 1102(N) will allow more gas to flow relative to injector valve 1102(1). Similarly each injector valve 1102 will allow more gas to flow as compared to the adjacent, inner radius injector valve 1102. Thus, gas flow will be dispersed in a uniform fashion through opening 1106, which runs the length of linear injector valve 1100 and which each wafer will pass under as it rotates within multi-wafer sequential deposition module 900.

It should also be understood that combinations of different types of showerheads could co-exist within multi-wafer sequential deposition module 900. Furthermore, one or more of the showerheads could be electrically powered for plasma generation. The wafers or substrates can also be alternately biased, such as by the application of electrical power or other power forms to the substrate holder, in this configuration. Periodic exposure by rotating the substrate under a radical, ion, or plasma stream is also possible.

Figure 12:
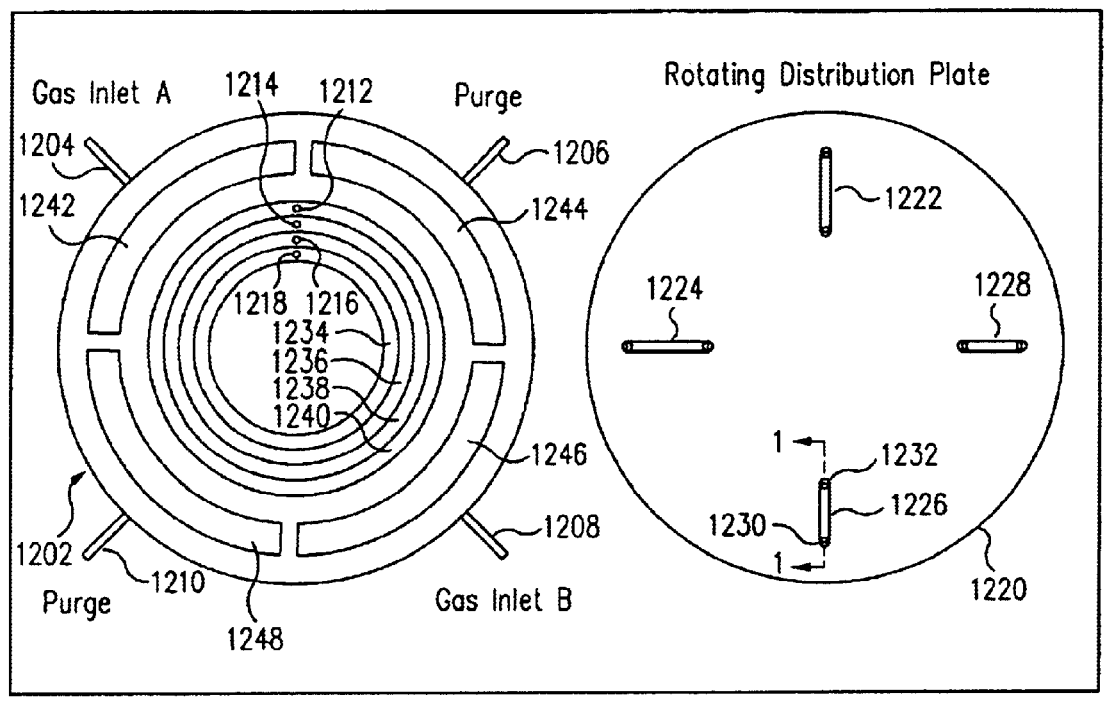
FIG. 12 illustrates a bottom view of an exemplary rotary ball valve in accordance with an embodiment of the present invention.

FIG. 12 illustrates a bottom view of an exemplary rotary ball valve in accordance with an embodiment of the present invention, which may be employed in one or more of the embodiments described herein. The rotary ball valve includes a base enclosure 1202 and a rotating distribution plate 1220 that fits within base enclosure 1202 (e.g., enclosing and sealing the bottom of base enclosure 1202).

Figure 13:
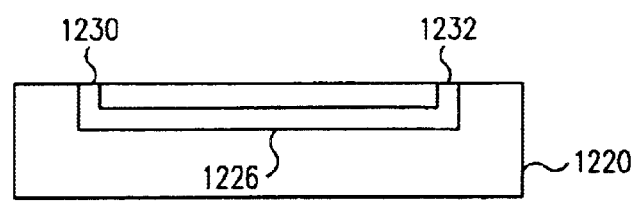
FIG. 13 illustrates a side view along lines 1—1 of FIG. 12 for a portion of the exemplary rotary ball valve.

Base enclosure 1202 includes gas inlets 1204, 1206, 1208, and 1210 and gas outlets 1212, 1214, 1216, and 1218. Rotating distribution plate 1220 includes connecting tubes 1222, 1224, 1226, and 1228 that each channel a gas from one of gas inlets 1204, 1206, 1208, or 1210 to one of gas outlets 1212, 1214, 1216, or 1218, as described below. A side view along lines 1—1 of FIG. 12 for connecting tube 1226 is illustrated in FIG. 13. As shown, connecting tube 1226 fits within a portion of rotating distribution plate 1220 and includes an opening 1230 to receive a gas from one of gas inlets 1204 through 1210 and an opening 1232 that provides the gas to one of gas outlets 1212 through 1218. Connecting tubes 1222, 1224, and 1228 have similar features as shown in FIG. 13 for connecting tube 1226.

Specifically and as shown in FIG. 12, connecting tubes 1222 through 1228 are each a different length to correspond with one of gas outlet zones 1234, 1236, 1238, and 1240. Connecting tube 1224 has the longest length and would channel one of the gases to gas outlet zone 1234, with the gas exiting through corresponding gas outlet 1218. Similarly, connecting tubes 1222, 1228, and 1226 correspond to gas outlet zones 1236, 1238, and 1240, respectively.

Rotating distribution plate 1220 rotates within base enclosure 1202, such as by mechanical or magnetic coupling for example. In an exemplary operation of the rotary ball valve, a gas A flows through gas inlet 1204, a purge gas flows through gas inlets 1206 and 1210, and a gas B flows through gas inlet 1208. The gases entering through gas inlets 1204, 1206, 1208, and 1210 are collected in chambers 1242, 1244, 1246, and 1248, respectively.

Connecting tubes 1222 through 1228, depending upon their rotational alignment, each transfer the gas from one of the corresponding chambers 1242 through 1248. For example, if connecting tube 1224 is aligned with chamber 1242, then the gas A is transferred from chamber 1242 to gas outlet zone 1234. Likewise, connecting tubes 1222, 1228, and 1226 transfer the respective gas from chambers 1244, 1246, and 1248 to gas outlet zones 1236, 1238, and 1240, respectively.

Rotating distribution plate 1220 can then be rotated as desired to channel the appropriate gases from the inlets to the appropriate outlets. Thus, connecting tubes 1222 through 1228 will alternatively connect the gas flow from gas inlet 1204 to one of the four gas outlet zones 1234 through 1240. In this manner the gas A flowing through gas inlet 1204 is seamlessly connected to one of the four gas outlet zones 1234 through 1240. The gas B flowing through gas inlet 1208 and the purge gas flowing through gas inlets 1206 and 1210 are also simultaneously switched along with the gas A.

The purge gas, in addition to purging the reactor itself (e.g., multi-wafer sequential deposition module 502), will serve to further isolate the gas A and the gas B within the rotary ball valve. The purge gas may be kept at a slightly higher pressure than the pressure of the gas A or the gas B to isolate the gas A and the gas B from each other in the rotary ball valve and prevent intermixing (e.g., if leakage occurs within the rotary ball valve).

It should be understood that the rotary ball valve shown in FIG. 12 is exemplary and that numerous modifications and variations are possible in accordance with the principles of the present invention. For example, gas inlets 1204 through 1210 and gas outlets 1212 through 1218 could be reversed so that gas inlets 1204 through 1210 are used as gas outlets and gas outlets 1212 through 1218 are used as inlets. Furthermore, the number of gas inlets and outlets may vary for the rotary ball valve, depending upon the processing requirements, and more than one rotary ball valve may be employed for each reactor.

ALD and CVD systems and methods are disclosed herein. In accordance with some embodiments, progressive gas switching (i.e., gases flowing continuously to the multi-wafer sequential deposition module, with the gases switched or directed sequentially among the various stations) is provided for a multi-station sequential reactor. Alternatively, the wafers may be continually rotated under fixed showerheads. These techniques allow, for example, the ALD process to be practically implemented for high-volume manufacturing. Furthermore, in accordance with some embodiments, ALD processing and conventional CVD processing are performed concurrently within a single multi-wafer processing chamber.

Embodiments described above illustrate but do not limit the invention. It should also be understood that numerous modifications and variations are possible in accordance with the principles of the present invention. For example, although tungsten was used as one example, one skilled in the art would realize that other materials, such as for example, titanium nitride, tantalum nitride, copper, aluminum, gate oxide, and high dielectric constant dielectrics would be applicable for the systems and methods described herein. Accordingly, the scope of the invention is defined only by the following claims.

We claim:

1. A method for performing atomic layer deposition, the method comprising:
    providing a multi-wafer sequential deposition module having a plurality of non-overlapping wafer stations;
    inserting a plurality of wafers within the multi-wafer sequential deposition module;
    rotating the plurality of wafers in a sequential fashion among the plurality of wafer stations;
    depositing at least one monolayer on each of the plurality of wafers at each of the plurality of wafer stations; and
    rotating a plurality of process gases within the deposition module in a sequential fashion among the plurality of wafer stations to complete the atomic layer deposition as each of the plurality of wafers.

2. The method of claim 1, further comprising inserting at least one additional wafer into the multi-wafer sequential deposition module and removing at least one of the plurality of wafers when a desired deposition layer thickness is obtained.

3. The method of claim 1, wherein the rotating of the plurality of process gases occurs by directing each of the plurality of process gases directly from one station to the next station among the plurality of wafer stations.

4. The method of claim 1, wherein the rotating of the plurality of process gases is performed by a rotary ball valve.

5. The method of claim 1, wherein the plurality of process gases includes a first process gas introduced at a first station of the plurality of wafer stations and a second process gas introduced at a second station of the plurality of wafer stations, wherein the first process gas and the second process gas are sequentially rotated among the plurality of wafer stations to complete a deposition layer for each of the plurality of wafers.

6. The method of claim 1, further comprising supplying an inert gas to each of the plurality of wafer stations that are not receiving one of the plurality of process gases.

7. The method of claim 1, further comprising flowing an inert gas between each of the plurality of wafer stations to isolate each of the plurality of process gases and prevent undesired deposition.

8. The method of claim 1, further comprising performing conventional chemical vapor deposition within the multi-wafer sequential deposition module concurrently with atomic layer deposition.

9. The method of claim 1, wherein the atomic layer deposition film is formed using at least one of a reactant gas, an ion stream, or a radical stream.

10. The method of claim 1, wherein at least one of the plurality of wafers is biased by delivering electrical power to a substrate holder of the corresponding wafer station.

11. The method of claim 1, wherein a spacing between a showerhead of at least one of the plurality of wafer stations and at least one of the plurality of wafers is set for plasma processing.

12. A method for performing atomic layer deposition in a multi-wafer sequential deposition module having a plurality of wafer stations, the method comprising:
    moving a plurality of wafers in a sequential order among the plurality or non-overlapping wafer stations;
    introducing a first process gas at a first station of the plurality of wafer stations;
    introducing a second process gas at a second station of the plurality of wafer stations; and
    rotating the first process gas and the second process gas within the deposition module sequentially to at least the first wafer station and the second wafer station of the plurality of wafer stations to form to atomic layer deposition film on corresponding wafers from the plurality of wafers positioned at the first wafer station and the second wafer station.

13. The method of claim 12, wherein the plurality of wafers receive a portion of a total deposition thickness at each of the plurality of wafer stations that receive the first process gas and the second process gas.

14. The method of claim 12, wherein the first process gas and the second process gas are not diverted from the plurality of water stations as the atomic layer deposition film is formed.

15. The method of claim 12, wherein the rotating of the first process gas and the second process gas is performed by a rotary ball valve.

16. The method of claim 12, further comprising flowing an inert gas to each of the plurality of wafer stations that are not receiving the first process gas or the second process gas.

17. The method of claim 12, further comprising flowing an inert gas between each of the plurality of wafer stations.

18. The method of claim 12, further comprising performing a conventional chemical vapor deposition process within the multi-wafer sequential deposition module for at least one of the plurality of wafer stations.

19. The method of claim 12, wherein the atomic layer deposition film is formed using at least one of a reactant gas, an ion stream, or a radical stream.

20. The method of claim 12, wherein at least one of the plurality of wafers is biased by delivering electrical power to the corresponding wafer station.

21. A method for applying a deposition layer on a semiconductor substrate, the method comprising:

providing a multi-wafer sequential deposition module having a plurality of non-overlapping wafer stations and a plurality of showerheads;

inserting a plurality of wafers within the multi-wafer sequential deposition module;

rotating and flowing one or more types of gas compositions through one or more of the plurality of showerheads, and rotating the plurality of wafers within the deposition module in a sequential, continuous fashion under the plurality of showerheads until a desired thickness of the deposition layer is formed.

22. The method of claim 21, wherein the deposition layer is formed by either an atomic layer deposition process or a chemical vapor deposition process.

23. The method of claim 21, wherein at least one of the plurality of showerheads has a triangular, or a linear shape.

24. The method of claim 21, wherein the deposition layer is formed using at least on of a reactant gas, an ion stream, or a radical stream dispensed by at least one of the plurality of showerheads.

25. The method of claim 21, further comprising providing an inert gas curtain between each of the plurality of showerheads.

26. The method of claim 21, wherein at least one of the plurality of showerheads is electrically powered to provide a plasma environment.

27. The method of claim 21, wherein at least one of the plurality of wafers is biased by delivering electrical power to a substrate holder of the corresponding wafer station.

28. The method of claim 27, wherein the film properties of the deposition layer formed on the wafer is modified due to plasma energy generated by the electrical power.

29. The method of claim 21, wherein a spacing between at least one of the plurality of showerheads and at least one of the plurality of wafers is set for plasma processing.

* * * * *